United States Patent
Ito et al.

(10) Patent No.: US 8,361,376 B2
(45) Date of Patent: Jan. 29, 2013

(54) PROCESS OF MAKING A THREE-DIMENSIONAL OBJECT

(75) Inventors: Takashi Ito, Yokohama (JP); Tsuneo Hagiwara, Yokohama (JP)

(73) Assignee: CMET Inc., Kanagawa (JP)

( * ) Notice: Subject to any disclaimer, the term of this patent is extended or adjusted under 35 U.S.C. 154(b) by 1332 days.

(21) Appl. No.: 11/993,355

(22) PCT Filed: Jun. 15, 2006

(86) PCT No.: PCT/JP2006/312065
§ 371 (c)(1), (2), (4) Date: Dec. 20, 2007

(87) PCT Pub. No.: WO2006/137329
PCT Pub. Date: Dec. 28, 2006

(65) Prior Publication Data
US 2010/0104804 A1    Apr. 29, 2010

(30) Foreign Application Priority Data
Jun. 20, 2005 (JP) .................................. 2005-179040

(51) Int. Cl.
*B29C 35/08* (2006.01)
*B29C 41/02* (2006.01)

(52) U.S. Cl. ....................................................... 264/401

(58) Field of Classification Search .................... 264/401
See application file for complete search history.

(56) References Cited

U.S. PATENT DOCUMENTS

| | | | |
|---|---|---|---|
| 2001/0003031 A1* | 6/2001 | Tamura et al. ............ | 264/401 X |
| 2004/0137368 A1 | 7/2004 | Steinmann | |
| 2007/0060682 A1* | 3/2007 | Ito et al. ........................ | 524/160 |
| 2009/0239175 A1 | 9/2009 | Steinmann | |

FOREIGN PATENT DOCUMENTS

| | | |
|---|---|---|
| EP | 0 938 026 A1 | 8/1999 |
| JP | 56-144478 A | 11/1981 |
| JP | 60-247515 A | 12/1985 |
| JP | 62-35966 A | 2/1987 |
| JP | 3-41126 A | 2/1991 |
| JP | 10-168165 A | 6/1998 |
| JP | 11-310626 A | 11/1999 |
| JP | 2001-139663 A | 5/2001 |

(Continued)

OTHER PUBLICATIONS

Chinese Office Action issued Dec. 2, 2011 from the Chinese Patent Office in counterpart Chinese Patent Application No. 200680022315.X (with English translation).

(Continued)

*Primary Examiner* — Leo B Tentoni
(74) *Attorney, Agent, or Firm* — Panitch Schwarze Belisario & Nadel LLP

(57) ABSTRACT

An optical three-dimensional shaped item excelling in the smoothness of molding end face. There is provided a three-dimensional shaped item composed of, superimposed one upon another, multiple cured resin layers having a given configurational pattern formed by irradiating with actinic energy rays a molding face consisting of an actinic energy ray curable resin composition, wherein at least part of an uneven region of molding end face of the three-dimensional shaped item, the degree of unevenness thereof is reduced to smoothness by segregation of a component contained in the actinic energy ray curable resin composition and/or a substance derived from the component. Also, there is provided an actinic energy ray curable resin composition for the three-dimensional shaped item.

2 Claims, 5 Drawing Sheets

| | FOREIGN PATENT DOCUMENTS | |
|---|---|---|
| JP | 2002-060463 A | 2/2002 |
| JP | 2002256057 A | 9/2002 |
| JP | 2004217934 A | 8/2004 |
| JP | 2005-15739 A | 1/2005 |
| JP | 2005-29579 A | 2/2005 |
| JP | 2005-336302 A | 12/2005 |
| WO | 2004033532 A1 | 4/2004 |
| WO | WO-2004113396 A1 * | 12/2004 |

OTHER PUBLICATIONS

Office Action issued Aug. 31, 2012 in JP Application No. 2007-537743 (with English translation).

* cited by examiner

PROCESS OF MAKING A THREE-DIMENSIONAL OBJECT

CROSS-REFERENCE TO RELATED APPLICATIONS

This application is a Section 371 of International Application No. PCT/JP2006/312065 filed Jun. 15, 2006, which was published in the English language on Dec. 28, 2006 under International Publication No. WO 2006/137329 A1, the disclosure of which is incorporated herein by reference.

BACKGROUND OF THE INVENTION

The present invention relates to a three-dimensional object including a plurality of cured resin layers stacked, having a predetermined shaped pattern formed by irradiating a fabricating surface of an actinic radiation-curable resin composition with an actinic radiation ray; an actinic radiation-curable resin composition for manufacturing the three-dimensional object; and a manufacturing method of the three-dimensional object. More particularly, the present invention relates to an optical three-dimensional object having an unevenness-reduced and smoothed fabricating surface to improve the surface smoothness and transparency of the fabricated edge surface; an actinic radiation-curable resin composition for manufacturing the three-dimensional object; and a manufacturing method of the three-dimensional object.

BACKGROUND ART

Recently, a stereolithography and apparatus for manufacturing a three-dimensional object by curing a photocurable resin composition in accordance with data input in a three-dimensional CAD have been put into practical use. The stereolithography has an advantage to easily mold a complex three-dimensional object such as a model to verify an external design in a design stage, a model to check functionality of components, a resin pattern to manufacture a casting mold, and a base model to manufacture a metal mold.

To manufacture a three-dimensional object by means of the stereolithography, a fabricating surface of a photocurable resin composition is selectively irradiated with computer-controlled light to photo-cure the surface with a predetermined thickness and to form a cured resin layer having a predetermined shaped pattern. Then, a photocurable resin composition for one layer is additionally applied to the cured resin layer to form a fabricating surface, and the fabricating surface is selectively irradiated with computer-controlled light to photo-cure the surface with a predetermined thickness and to form a cured resin layer having a predetermined shaped pattern. Such molding fabrication is repeated several times until a three-dimensional object having a predetermined size and shape is formed (refer to Patent Documents 1 to 4).

A three-dimensional object formed by the foregoing stereolithography has such a configuration that a plurality of cured resin layers L1, L2, L3, L4, L5, . . . are stacked, as shown in FIG. 4.

In the three-dimensional object having the plurality of cured resin layers stacked, a fabricated edge part of the respective cured resin layers (e.g. L1, L2, L3, L4 and L5), i.e. a fabricated edge part (e.g. L1$e$ of a layer L1, L2$e$ of a layer L2, L3$e$ of a layer L3, L4$e$ of a layer L4 and L5$e$ of a layer L5) which contacts a part of the fabricating surface of the photocurable resin composition not irradiated with light (a part in which the resin composition is not cured) has a thickness different from that of an internal part of the cured resin layer or is difficult to be precisely formed as designed, as shown in FIG. 4. As a result, the fabricated edge (surface Sz in a direction Z in FIG. 4) of the three-dimensional object, which is constituted by the plurality of fabricated edge parts, is liable to have a plurality of minute uneven portions and to be less smooth.

As shown in (a) and (b) in FIG. 5, for example, when the shape of the three-dimensional object (particularly, the shape of the fabricated edge surface) has a tapered or curved shape, a step is generated in the fabricated edge parts of the respective cured resin layers even though the thickness of the fabricated edge parts (e.g. L1$e$ of a layer L1, L2$e$ of a layer L2, L3$e$ of a layer L3, L4$e$ of a layer L4 and L5$e$ of a layer L5 in FIG. 5) is equivalent to that of the internal part of the respective cured resin layers and the fabricated edges are shaped in a vertical form, and the fabricated edge (surface Sz in a direction Z in FIG. 5) of the three-dimensional object, which is constituted by the plurality of fabricated edge parts, is liable to have a plurality of minute uneven portions and to be less smooth.

Further, since the stereolithography can be used to manufacture a complex three-dimensional object, for example, as shown in FIG. 6, the three-dimensional object often includes a hollow part therein ((a) in FIG. 6 is a plan view of the three-dimensional object seen from above, and (b) is a longitudinal sectional view of the three-dimensional object). In this case, not only an external surface (external wall) of the three-dimensional object is fabricated edge parts (e.g. L1$e$ of layer L1, L2$e$ of a layer L2, L3$e$ of a layer L3, L4$e$ of a layer L4 and L5$e$ of a layer L5) of the respective cured resin layers, but also an internal wall (internal circumference) of the hollow part is fabricated edge parts (e.g. L1$e'$ of a layer L1, L2$e'$ of a layer L2, L3$e'$ of a layer L3, L4$e'$ of a layer L4 and L5$e'$ of a layer L5) thereof. Unevenness of thickness and molding errors occur in both the fabricated edge parts (e.g. L1$e$, L2$e$, L3$e$, L4$e$ and L5$e$) forming the external circumference (external wall) of the three-dimensional object and the fabricated edge parts (e.g. L1$e'$, L2$e'$, L3$e'$, L4$e'$ and L5$e'$) forming the internal wall (internal circumference) of the hollow part, and the fabricated edge (external circumference Sz and internal circumference Sz' in a vertical direction in FIG. 6) of the three-dimensional object, which is constituted by the plurality of fabricated edge parts, is liable to have a plurality of minute uneven portions and to be less smooth.

When the fabricating surface of the three-dimensional object has the plurality of minute uneven portions and is less smooth, an external appearance and a sense of touch may be lowered. Further, when the three-dimensional object is formed from a transparent optical curable resin, diffused reflection occurs from the minute uneven portions and the three-dimensional object is opaque or semi-transparent, but not transparent, if seen in a transverse direction of the fabricated edge (a direction perpendicular to the surface Sz in FIGS. 4, 5 and 6) of the three-dimensional object. When the fabricated edge having the plurality of minute uneven portions is present in the external circumference (external wall) of the three-dimensional object (in case of the surface Sz in FIGS. 4, 5 and 6), the fabricated edge in the external circumference can be polished to be smoothed, while it takes a lot of efforts.

However, when the fabricated edge having the plurality of minute uneven portions is present in the internal wall (internal circumference) of the three-dimensional object (e.g. in case of the surface Sz' of the three-dimensional object having the hollow part in FIG. 6), the internal wall (internal circumference) may not be polished easily. Particularly, when the hollow part which does not communicate with the outside is formed in the internal part of the three-dimensional object, when the size of the hollow part is small even if it communicates with the outside is small, or when the hollow part of the three-dimensional object is bent or curved, it is not possible to polish and smooth the fabricated edge in the internal wall (internal circumference) of the hollow part and having the minute uneven portions. When the plurality of minute uneven portions is formed in the fabricated edge of the internal wall (internal circumference) of the hollow part existing in the three-dimensional object, diffused reflection occurs from the uneven portions, thereby making the three-dimensional object opaque or semi-transparent, and even if the three-dimensional object is manufactured by using the photocurable resin composition which is transparent after photo-curing, the three-dimensional object which is transparent as a whole can not be obtained. For example, in the three-dimensional object where the hollow part provided inside of the object corresponds to a pipe to flow liquid therethrough, the inside of the pipe is not shown due to the diffused reflection caused by the uneven portions of the internal wall (internal circumference) of the hollow part, which causes a disadvantage that a user may not know whether the liquid flows within the pipe.

(Patent Document 1) JP-A-56-144478
(Patent Document 2) JP-A-60-247515
(Patent Document 3) JP-A-62-35966
(Patent Document 4) JP-A-3-41126

BRIEF SUMMARY OF THE INVENTION

An object of the present invention is to provide a three-dimensional object which has a plurality of cured resin layers stacked and which is manufactured by irradiating a fabricating surface of an actinic radiation-curable resin composition, which is cured upon irradiation of an actinic radiation ray such as light, with the actinic radiation ray to form a cured resin layer having a predetermined shaped pattern, and repeating a fabrication procedure including: providing an actinic radiation-curable resin composition on the cured resin layer to form a fabricating surface; and irradiating the fabricating surface with the actinic radiation ray to form a cured resin layer having a predetermined shaped pattern, wherein the unevenness degree of a minute uneven portion of the fabricated edge is more reduced than that in the background, the fabricated edge is smoothed to improve the external appearance and the sense of touch, the polishing treatment after the fabricating is not required, and even if the polishing treatment is required, it is possible to easily perform the polishing treatment, and a manufacturing method of the three-dimensional object and an actinic radiation-curable resin composition for manufacturing the three-dimensional object.

Also, another object of the present invention is to provide a three-dimensional object having a plurality of cured resin layers stacked, formed from a transparent optical cured resin, wherein the unevenness degree of a minute uneven potion at the fabricated edge is reduced so that the uneven portion is smoothed and diffused reflection at the fabricated edge is prevented or suppressed to improve transparency of the entire three-dimensional object, and a manufacturing method of the three-dimensional object and an actinic radiation-curable resin composition for manufacturing the three-dimensional object.

Means for Solving the Problems

To achieve the foregoing objects, the present inventors have keenly examined the problems. As a result, it was found that in the three-dimensional object which has a plurality of cured resin layers stacked and which is manufactured by irradiating a fabricating surface of an actinic radiation-curable resin composition with an actinic radiation ray to form a cured resin layer having a predetermined shaped pattern, and repeating a fabrication procedure including: providing an actinic radiation-curable resin composition on the cured resin layer to form a fabricating surface; and irradiating the fabricating surface with the actinic radiation ray to form a cured resin layer having a predetermined shaped pattern, by segregating a component included in the actinic radiation-curable resin composition and/or a material originated from the component to the uneven portion of the fabricated edge, the segregation component fills the uneven portion of the fabricated edge to reduce the unevenness degree and to make the fabricated edge smooth, thereby improving the external appearance and a sense of touch of the three-dimensional object. It was also found that in the case where the three-dimensional object is formed from a transparent cured resin, the fabricated edge of the three-dimensional object is smoothed by the segregation of the component and/or the material originated therefrom, and thus, even if the fabricating surface is present in the internal part of the three-dimensional object as the internal wall (internal circumference) such as a hollow part as well as the external circumference (external wall) of the three-dimensional object, diffused reflection at the fabricated edge is prevented, thereby making the overall three-dimensional object transparent.

Also, the present inventors have found that the component segregated to the fabricated edge of the three-dimensional object may be either a compound which has a group reacting upon irradiation of the actinic radiation ray or a compound which does not have the group reacting upon irradiation of the actinic radiation ray, and particularly, in the case where the actinic radiation-curable resin composition includes at least one of (A) a (meth)acrylate compound having at least one of a long-chain alkyl group and a long-chain alkenyl group which have 8 or more carbon atoms and which may be branched; (B) an epoxy compound having at least one of a long-chain alkyl group and a long-chain alkenyl group which have 8 or more carbon atoms and which may be branched; (C) a hindered phenol compound; (D) a dialkyl phthalate compound having an alkyl group with 8 or more carbon atoms; and (E) a trialkyl trimellitate compound having an alkyl group with 8 or more carbon atoms, the compound and/or the material originated therefrom is segregated to the fabricated edge to reduce the unevenness degree so that the fabricated edge is smoothed.

Also, the present inventors have found that in the case where as the actinic radiation-curable resin composition, used is that including a cationic polymerizable organic compound, a radical polymerizable organic compound, an actinic radiation-sensitive cationic-polymerization initiator and an actinic radiation-sensitive radical-polymerization initiator, which are different from the segregation component, together with the segregation component at the fabricated edge of the cured resin layer in forming the cured resin layer, which is at least one of the compounds (A) to (E), and in the case where the actinic radiation-curable resin composition includes an oxetane monoalcohol compound and/or a (meth)acrylate compound having an oxetane ring, the compound and/or the material originated therefrom is segregated to the fabricated edge to reduce the unevenness degree of the fabricated edge, thereby achieving the three-dimensional object having the smoothed fabricated edge, the molding speed is raised to mold the three-dimensional object, and further mechanical properties and molding accuracy of the achieved three-dimensional object are enhanced. The present inventors have accomplished the present invention based on the findings.

That is, the present invention relates to (1) a three-dimensional object including a plurality of cured resin layers stacked, each having a shaped pattern formed by irradiating a fabricating surface of an actinic radiation-curable resin composition with an actinic radiation ray, wherein an unevenness degree of at least a part of an uneven portion in a fabricated edge of the three-dimensional object is reduced by segregation of a component included in the actinic radiation-curable resin composition and/or a material originated from the component, so that the fabricated edge is smoothed.

Also, the present invention relates to (2) a three-dimensional object in (1), in which the unevenness degree of the entire uneven portion at the fabricated edge of the three-dimensional object is reduced by segregation of a component included in the actinic radiation-curable resin composition and/or a material originated from the component, so that the fabricated edge is smoothed;

(3) a three-dimensional object in (1) or (2), in which a surface roughness Ra of the at least a part of the uneven portion at the fabricated edge of the three-dimensional object is 4,000 Å or below due to segregation of at least one of a component included in the actinic radiation-curable resin composition and a material originated from the component; and (4) a three-dimensional object in any one of (1) to (3), in which the component and/or the material originated from the component, which is segregated to the at least a part of the uneven portion at the fabricated edge of the three-dimensional object, is one or at least two compounds selected from a compound having a group reacting upon irradiation of the actinic radiation ray and a compound not having the group reacting upon irradiation of the actinic radiation ray, and/or a material originated from the one or at least two compounds.

Also, the present invention relates to (5) a three-dimensional object in any one of (1) to (4), in which the component and/or the material originated from the component, which is segregated to the at least a part of the uneven portion at the fabricated edge of the three-dimensional object, is at least one compound selected from (A) to (E) and/or a material originated from the at least one compound:

(A) a (meth)acrylate compound having at least one group selected from a long-chain alkyl group which has 8 or more carbon atoms and which may be branched, and a long-chain alkenyl group which has 8 or more carbon atoms and which may be branched;

(B) an epoxy compound having at least one group selected from a long-chain alkyl group which has 8 or more carbon atoms and which may be branched, and a long-chain alkenyl group which has 8 or more carbon atoms and which may be branched;

(C) a hindered phenol compound;

(D) a dialkyl phthalate compound which has an alkyl group having 8 or more carbon atoms; and (E) a trialkyl trimellitate compound which has an alkyl group having 8 or more carbon atoms.

Also, the present invention relates to (6) a three-dimensional object in any one of (1) to (5), which is formed from the actinic radiation-curable resin composition including: together with the component segregated to the fabricated edge of a cured resin layer when the cured resin layer is formed and including at least one compound selected from the (A) to (E), a cationic polymerizable organic compound; a radical polymerizable organic compound; an actinic radiation-sensitive cationic-polymerization initiator; and an actinic radiation-sensitive radical-polymerization initiator, which are different from the segregated component; and (7) a three-dimensional object in (6) in which the actinic radiation-curable resin composition used to form the three-dimensional object includes an oxetane monoalcohol and/or a (meth)acrylate compound having an oxetane ring.

Also, the present invention relates to (8) an actinic radiation-curable resin composition used for manufacturing a three-dimensional object which includes a plurality of cured resin layers stacked, each having a shaped pattern formed by irradiating a fabricating surface of an actinic radiation-curable resin composition with an actinic radiation ray and which reduces an unevenness degree of at least a part of an uneven portion at a fabricated edge of the three-dimensional object by segregation of a component included in the actinic radiation-curable resin composition and/or a material originated from the component, so that the fabricated edge is smoothed, the actinic radiation-curable resin composition includes the component which is segregated to the fabricated edge of a cured resin layer when the cured resin layer is formed.

Also, the present invention relates to (9) an actinic radiation-curable resin composition for three-dimensional molding in (8), in which the component segregated to the fabricated edge of the cured resin layer includes at least one compound selected from (A) to (E):

(A) a (meth)acrylate compound having at least one group selected from a long-chain alkyl group which has 8 or more carbon atoms and which may be branched, and a long-chain alkenyl group which has 8 or more carbon atoms and which may be branched;

(B) an epoxy compound having at least one group selected from a long-chain alkyl group which has 8 or more carbon atoms and which may be branched, and a long-chain alkenyl group which has 8 or more carbon atoms and which may be branched;

(C) a hindered phenol compound;

(D) a dialkyl phthalate compound which has an alkyl group having 8 or more carbon atoms; and (E) a trialkyl trimellitate compound which has an alkyl group having 8 or more carbon atoms.

Also, the present invention relates to

(10) an actinic radiation curable resin composition for three-dimensional molding in (8) or (9), which further includes: together with the component segregated to the fabricated edge of a cured resin layer when the cured resin layer is formed and including at least one compound selected from the (A) to (E), a cationic polymerizable organic compound; a radical polymerizable organic compound; an actinic radiation-sensitive cationic-polymerization initiator; and an actinic radiation-sensitive radical-polymerization initiator, which are different from the segregated component;

(11) an actinic radiation-curable resin composition for three-dimensional molding in (10), which further includes an oxetane monoalcohol and/or a (meta)acrylate compound having an oxetane ring; and

(12) an actinic radiation-curable resin composition for three-dimensional molding in any one of (8) to (11), in which a content of the component segregated to the fabricated edge of the cured resin layer when the cured resin layer is formed is 1 to 20 wt % of a total weight of the actinic radiation-curable resin composition.

Also, the present invention relates to

(13) a method for manufacturing a three-dimensional object, comprising:

forming a fabricating surface of an actinic radiation-curable resin composition in any one of (8) to (12);

irradiating the fabricating surface with an actinic radiation ray to form a cured resin layer having a shaped pattern;

repeating a fabricating procedure including: providing the actinic radiation-curable resin composition on the cured resin layer to form a fabricating surface; and irradiating the fabricating surface with an actinic radiation ray to form a cured resin layer having a shaped pattern, the three-dimensional object which includes a plurality of cured resin layers stacked and which reduces an unevenness degree of at least a part of an uneven portion at a fabricated edge of the three-dimensional object by segregation of a component included in the actinic radiation-curable resin composition and/or a material originated from the component, so that the fabricated edge is smoothed.

Effect of the Invention

In a three-dimensional object according to the present invention, the component included in the actinic radiation-curable resin composition and/or the material originated from the component is segregated to the fabricated edge and fills the uneven portion of the fabricated edge, thereby reducing the unevenness degree of the fabricated edge and making the fabricated edge smooth to improve the external appearance and a sense of touch of the three-dimensional object.

Further, in the case where a three-dimensional object according to the present invention is formed from a transparent cured resin, the fabricated edge of the three-dimensional object is smoothed by a segregation of the component and/or the material originated from the component, and thus, even if the fabricated edge is present in the internal part of the three-dimensional object as the internal wall (internal circumference) such as a hollow part as well as in the external circumference (external wall) of the three-dimensional object, diffused reflection is prevented from occurring at the fabricated edge and the overall three-dimensional object is transparent.

In a three-dimensional object according to the present invention, since the fabricated edge is smoothed by the segregation as described above, post-processing such as polishing treatment to smooth the fabricated edge of the three-dimensional object, which requires a lot of efforts, is not needed. Further, even if the polishing treatment and the like is required, it is possible to more easily perform the treatment than that in the background art.

In the present invention, in the case where as a component segregated to the uneven portion of the fabricated edge, particularly at least one compound selected from: (A) a (meth) acrylate compound having at least one group selected from a long-chain alkyl group which has 8 or more carbon atoms and which may be branched, and a long-chain alkenyl group which has 8 or more carbon atoms and which may be branched; (B) an epoxy compound having at least one group selected from a long-chain alkyl group which has 8 or more carbon atoms and which may be branched, and a long-chain alkenyl group which has 8 or more carbon atoms and which may be branched; (C) a hindered phenol compound; (D) a dialkyl phthalate compound which has an alkyl group having 8 or more carbon atoms; and (E) a trialkyl trimellitate compound which has an alkyl group having 8 or more carbon atoms, is included in an actinic radiation-curable resin composition for manufacturing a three-dimensional object, it is possible to make the fabricated edge smooth without difficulty.

Further, in the present invention, by using as an actinic radiation-curable resin composition, a composition including: together with the component segregated to the fabricated edge of a cured resin layer when the cured resin layer is formed and including at least one compound selected from the (A) to (E), a cationic polymerizable organic compound; a radical polymerizable organic compound; an actinic radiation-sensitive cationic-polymerization initiator; and an actinic radiation-sensitive radical-polymerization initiator, which are different from the segregated component, the compound and/or the material originated from the compound is segregated to the fabricated edge to educe the unevenness degree of the fabricating surface, thereby smoothly achieving a three-dimensional object having a smoothed fabricating surface and obtaining a three-dimensional object the fabricating speed of which is raised and the mechanical properties and molding accuracy are improved.

BRIEF DESCRIPTION OF THE SEVERAL VIEWS OF THE DRAWINGS

The foregoing summary, as well as the following detailed description of the invention, will be better understood when read in conjunction with the appended drawings. For the purpose of illustrating the invention, there are shown in the drawings embodiments which are presently preferred. It should be understood, however, that the invention is not limited to the precise arrangements and instrumentalities shown.

In the drawings.

DETAILED DESCRIPTION OF THE INVENTION

Best Mode for Carrying Out the Invention

Hereinafter, the invention will be described with reference to the accompanying drawings.

A three-dimensional object according to the present invention including a plurality of cured resin layers having a predetermined shaped pattern formed by irradiating a fabricating surface of an actinic radiation-curable resin composition with an actinic radiation ray, in which a component included in the actinic radiation-curable resin composition and/or a material originated from the component is segregated to at least a part of an uneven portion of a fabricated edge of the three-dimensional object to fill the uneven portion thereof, thereby reducing the unevenness degree of the fabricated edge and making the uneven portion smooth.

In the present specification, "a fabricated edge (layered edge) of a three-dimensional object" means a fabricated edge, in the three-dimensional object including a plurality of cured resin layer stacked, constituted by stacking a fabricated edge part in each cured resin layer having a predetermined shaped pattern, i.e., a fabricated edge part contacting an uncured resin composition which are not irradiated with light in a fabricating surface of an actinic radiation-curable resin composition In the present application, "a component included in an actinic radiation-curable resin composition and/or a material originated from the component is segregated to at least a part of an uneven portion in a fabricated edge of a three-dimensional object" means that a component and/or a material originated from the component (e.g. a reaction product of the component, etc.) exists in a part or overall uneven portion of the fabricated edge of the three-dimensional object in a larger amount (higher concentration) than in other parts (e.g. inside of the three-dimensional object) of the three-dimensional object.

In the present specification, "an actinic radiation ray" means a radiation ray such as ultraviolet rays, electronic rays, X-rays, radiation rays and high frequency waves, which may cure a resin composition.

Hereinafter, a three-dimensional object according to the present invention will be described with reference to drawings.

Figure 1:
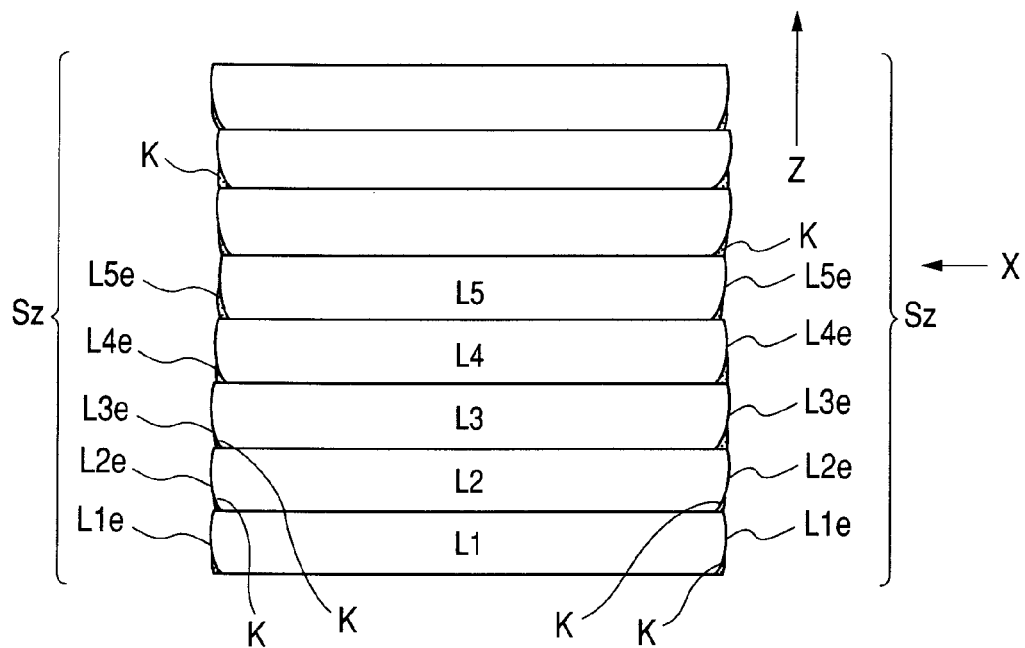
FIG. 1 illustrates a three-dimensional object according to an example of the present invention, in which the unevenness degree of the fabricated edge is reduced by segregation of a component and/or a material originated from the component so that the fabricated edge is smoothed.
Figure 2A:
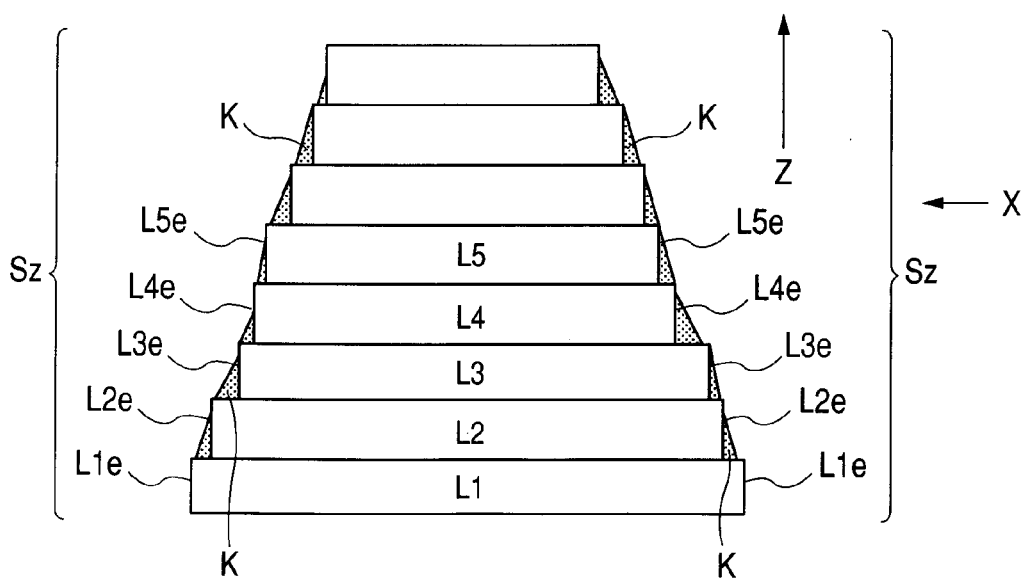
FIG. 2A illustrates a three-dimensional object according to another example of the present invention.
Figure 2B:
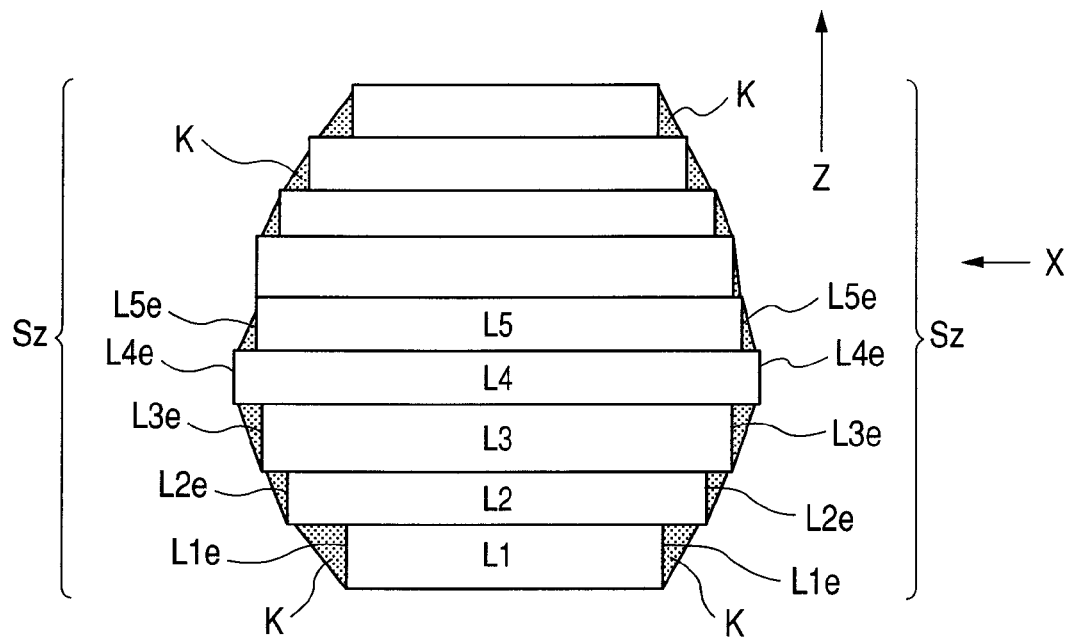
FIG. 2B illustrates a three-dimensional object according to another example of the present invention.
Figure 3A:
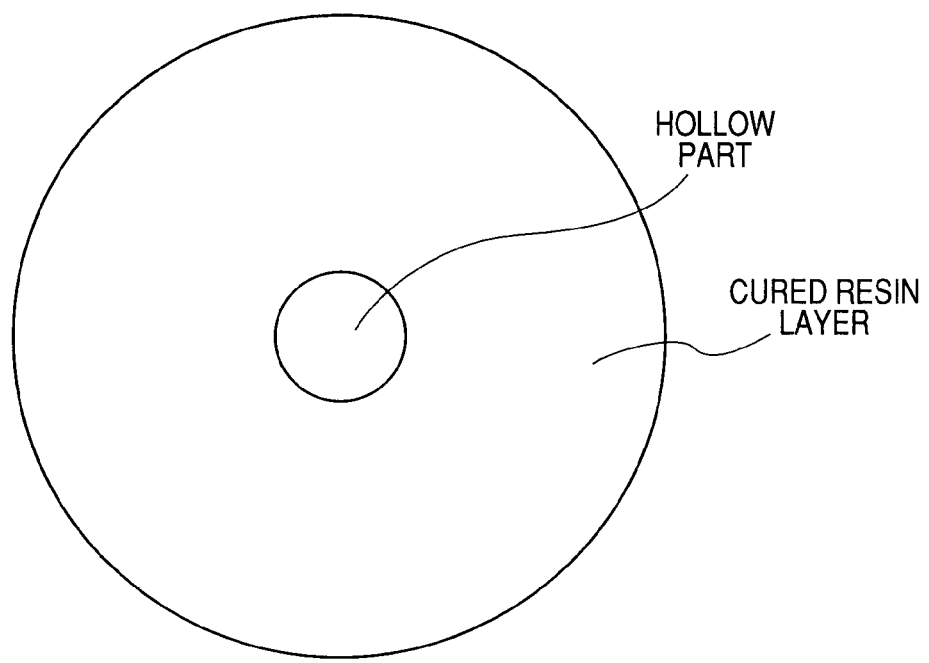
FIG. 3A illustrates a three-dimensional object according to another example of the present invention.
Figure 3B:
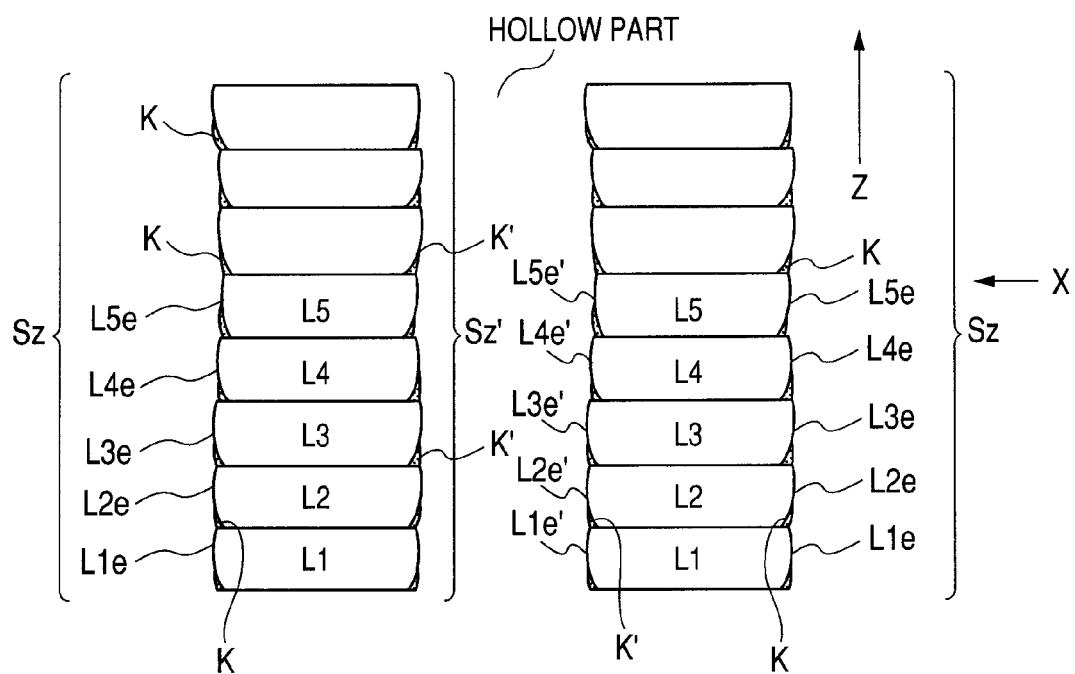
FIG. 3B illustrates a three-dimensional object according to another example of the present invention.
Figure 4:
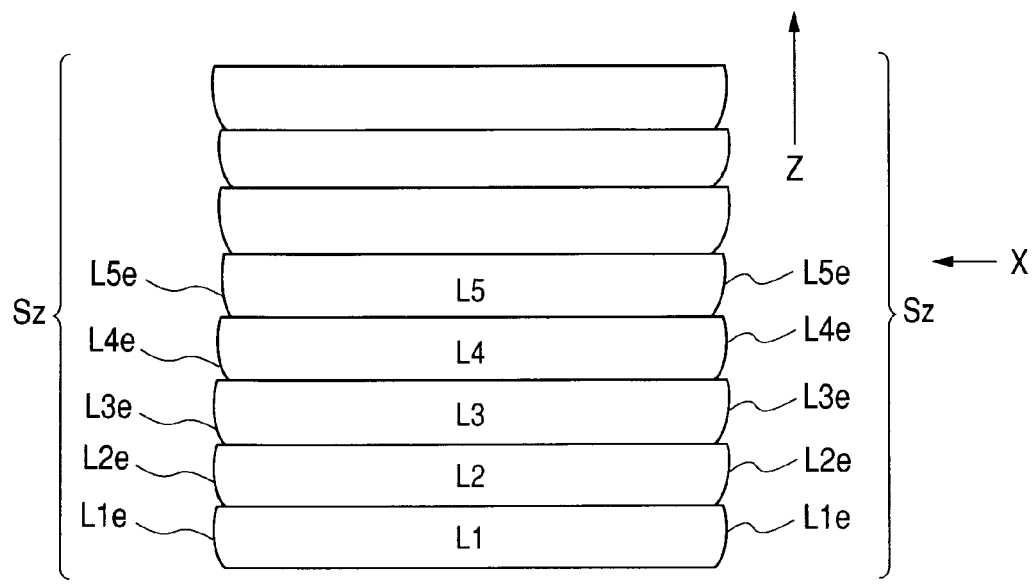
FIG. 4 illustrates an example of a three-dimensional object in the background art, which has an uneven portion in the fabricated edge.
Figure 5A:
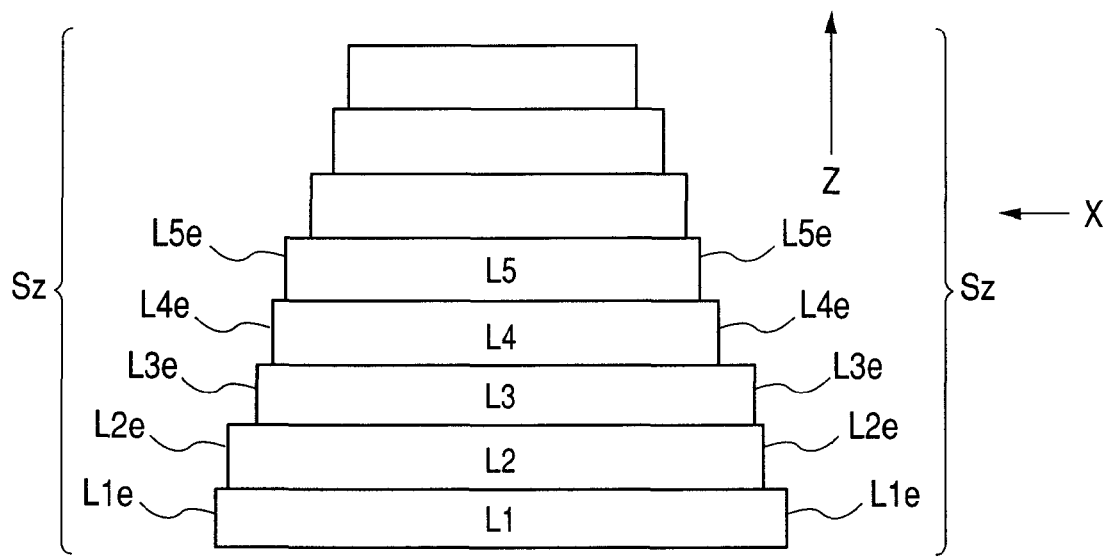
FIG. 5A illustrates another example of a three-dimensional object in the background art, which has an uneven portion in the fabricated edge.
Figure 5B:
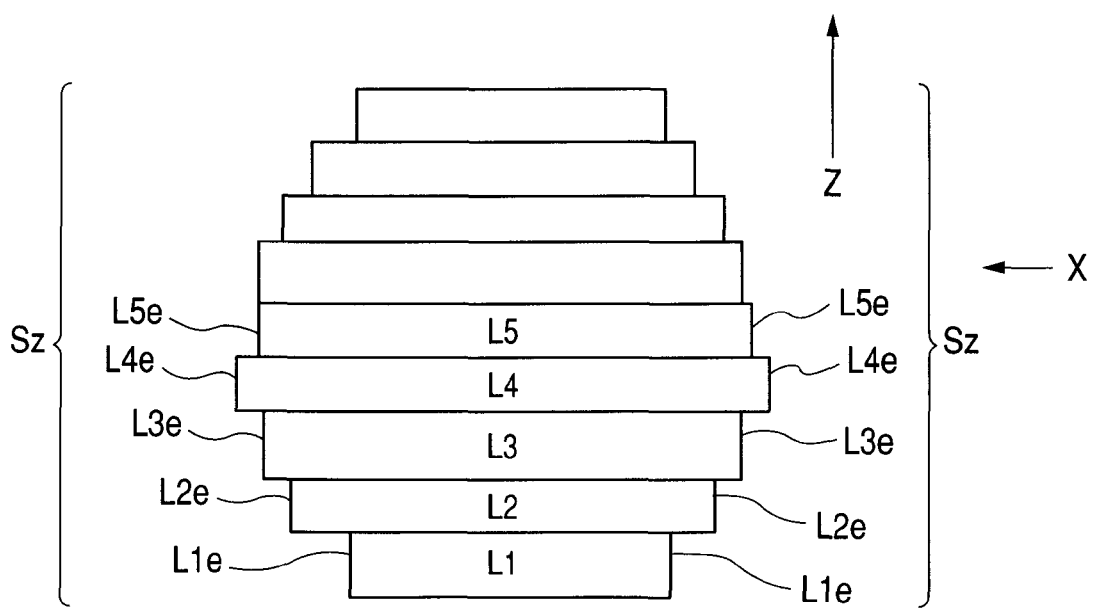
FIG. 5B illustrates another example of a three-dimensional object in the background art, which has an uneven portion in the fabricated edge.

FIGS. 1 to 3 illustrate examples of a three-dimensional object according to the present invention. L1$e$ of a layer L1, L2$e$ of a layer L2, L3$e$ of a layer L3, L4$e$ of a layer L4, L5$e$ of a layer L5, . . . in FIGS. 1 to 3 and L1$e'$ of a layer L1, L2$e'$ of a layer L2, L3$e'$ of a layer L3, L4$e'$ of a layer L4, L5$e$ of a layer L5, . . . in FIG. 3 each correspond to a fabricated edge part of each cured resin layer. Each of a surface Sz formed by stacking the fabricated edge parts L1$e$, L2$e$, L3$e$, L4$e$, L5$e$, . . . and a surface Sz$'$ formed by stacking the fabricated edge parts L1$e'$, L2$e'$, L3$e'$, L4$e'$, L5$e'$, . . . is a fabricated edge of the three-dimensional object according to the present invention. This is the same as in cases of the three-dimensional objects (corresponding to three-dimensional objects in the background art) referring to FIGS. 4 to 6.

Figure 6A:
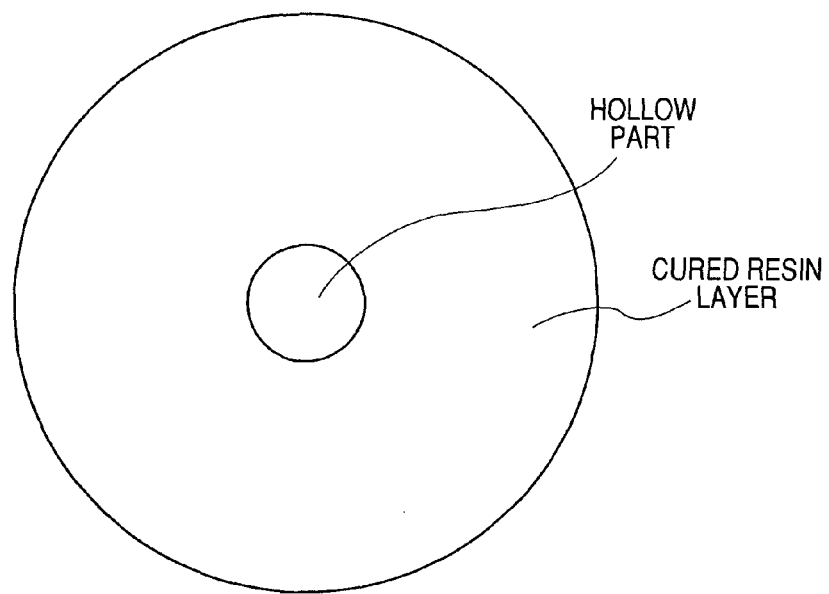
FIG. 6A illustrates another example of a three-dimensional object in the background art, which has an uneven portion in the fabricated edge.
Figure 6B:
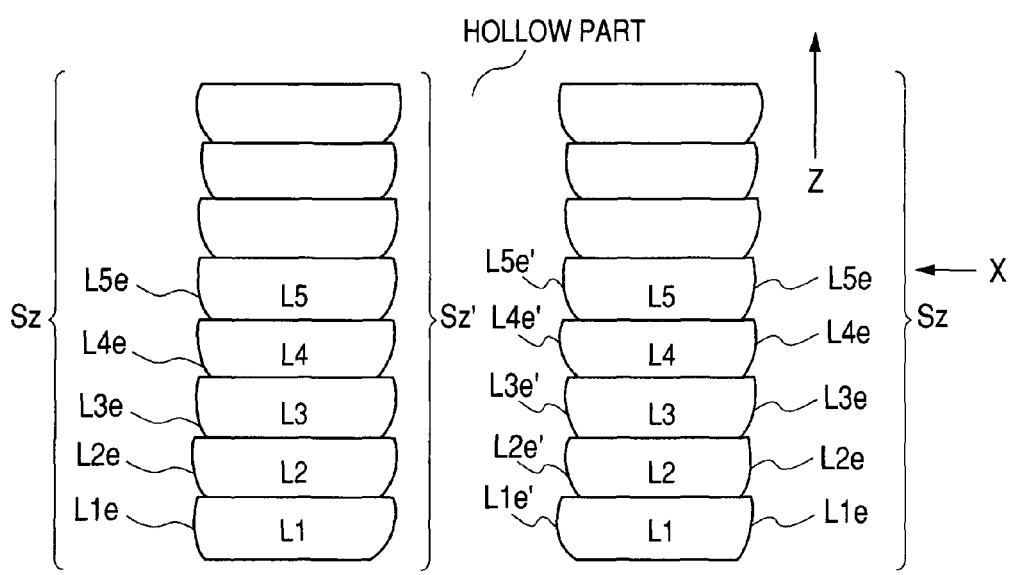
FIG. 6B illustrates another example of a three-dimensional object in the background art, which has an uneven portion in the fabricated edge.

As shown in FIGS. 1 to 6, the fabricated edge may be present in an external circumference (external wall) of the three-dimensional object (refer to FIGS. 1, 2, 4 and 5) or present in both an external circumference (external wall) and an internal part (internal circumference or internal wall) of the three-dimensional object (refer to FIGS. 3 and 6).

As shown in FIGS. 1 to 3, in a three-dimensional object according to the present invention, a component included in the actinic radiation-curable resin composition and/or a material originated from the component is segregated to the fabricated edge parts of the respective cured resin layers, and further to the fabricating surface of the three-dimensional fabricating surface (K and K$'$ in FIGS. 1 to 3 refer to the segregation of the component and/or the material), and by the segregation, at least a part of a plurality of minute uneven portion present in the fabricated edge due to stacking the plurality of cured resin layers is partly or overall filled, thereby reducing the unevenness degree of the uneven portion and making the fabricated edge smooth.

In a three-dimensional object according to the present invention, the component included in the actinic radiation-curable resin composition and/or the material originated from the component may be segregated to a part of the uneven portion of the fabricated edge to reduce the unevenness degree of the part of the uneven portion and make the part of the fabricated edge smooth, or may be segregated to the overall uneven portion of the fabricated edge to reduce the unevenness degree of the overall fabricated edge and make the overall fabricated edge smooth. Preferably, the component included in the actinic radiation-curable resin composition and/or the material originated from the component is segregated to the overall uneven portion of the fabricated edge of the three-dimensional object to make the overall fabricating surface smooth.

(Hereinafter, the component which is included in the actinic radiation-curable resin composition and is segregated to the fabricated edge is called "the segregation component", and the component segregated to the fabricated edge and the material originated from the component is called "the segregation material".)

In an uneven portion of the fabricated edge of a three-dimensional object according to the present invention, the fact that the segregation component included in the actinic radiation-curable resin composition and/or the material originated from the segregation component is segregated, and the fact that the unevenness degree of the uneven portion of the fabricated edge is reduced by the segregation material to smooth the fabricated edge can be determined by, for example, following conditions:

(1) When a composition analysis of the surface in the fabricated edge of the three-dimensional object according to the present invention is conducted by X-ray photoelectron spectroscopy (ESCA), a concentration of a particular element (e.g. carbon and oxygen) in the fabricated edge is higher than that in a three-dimensional object (a three-dimensional object in the background art) manufactured with an active radiation-curable resin composition being the same composition as in the composition of the present invention except that the segregation component is not included;

(2) While a surface roughness Ra of the fabricated edge of the three-dimensional object (whose fabricated edge is not polished) according to the present invention is generally 4,000 Å or below, preferably 3,000 Å or below, more preferably 2,000 Å or below, and more preferably 1,000 Å or below, a surface roughness Ra of a fabricated edge of a three-dimensional object without the segregation in the background art (a three-dimensional object in the background art before a fabricating surface thereof is polished) is typically 5,000 Å to 10,000 Å, and thus, the surface roughness Ra of the fabricated edge of the three-dimensional object according to the present invention is lower than the surface roughness Ra of the fabricated edge of the three-dimensional object in the background art; and (3) A transparency of the fabricated edge of the three-dimensional object according to the present invention is clearly higher than that of the fabricated edge of the three-dimensional object in the background art.

Here, a surface roughness Ra of a fabricated edge in the present specification means a surface roughness Ra (i.e. an arithmetic average roughness Ra) calculated by JIS B0601, and the detailed calculation method will be described in Examples later.

Although it is not clear why the component included in the actinic radiation-curable resin composition and/or the material originated from the component is segregated to the uneven portion of the fabricated edge of the three-dimensional object according to the present invention, it is presumed that the segregation component is migrated to the fabricated edge parts of the respective cured resin layers when the actinic radiation ray are irradiated to form the cured resin layers.

The amount of the segregation material in the fabricated edge of the three-dimensional object according to the present invention can be adjusted by adopting or selecting the kind or amount of the segregation component included in the actinic radiation-curable resin composition, the kind or composition of a curable resin component included in the actinic radiation-curable resin composition, and molding conditions of forming the respective cured resin layers.

In the present invention, the kind of the segregation material of the fabricating surface of the three-dimensional object is not particularly limited, and any segregation material may be used as long as it is segregated to the fabricated edge of the three-dimensional object and is not easily separated or detached from the fabricated edge of the three-dimensional object obtained by stereolithography. From this point, the segregation material may is one or two or more selected from a compound having a group reacting upon irradiation of an actinic radiation ray and a compound not having a group reacting upon irradiation of the actinic radiation ray and/or the material originated from the compound.

Particularly, when a three-dimensional object is manufactured by using an actinic radiation-curable resin composition including at least one compound selected from following (A) to (E) as a segregation component, the at least one compound selected from (A) to (E) and/or the material originated from the compound is segregated to at least a part of the uneven portion in the fabricated edge of the three-dimensional object to reduce the unevenness degree of the fabricated edge and to appropriately make the fabricated edge smooth.

(A) A (meth) acrylate compound having at lest one group selected from a long-chain alkyl group and a long-chain alkenyl group which has 8 or more carbon atoms and which may be branched (hereinafter, referred to as a (meth)acrylate compound (A));

(B) An epoxy compound having at least one group selected from a long-chain alkyl group and a long-chain alkenyl group which has 8 or more carbon atoms and which may be branched (hereinafter, referred to as an epoxy compound (B));

(C) A hindered phenol compound (hereinafter, referred to as a hindered phenol compound (C));

(D) A dialkyl phthalate compound having an alkyl group having 8 or more carbon atoms (hereinafter, referred to as a dialkyl phthalate compound (D)); and (E) A trialkyl trimellitate compound having an alkyl group having 8 or more carbon atoms (hereinafter, referred to as a trialkyl trimellitate compound (E)).

As a (meth) acrylate compound (A) of the segregation component, any compound may be used as long as it is a (meth) acrylate compound having one or two or more groups selected from a long-chain alkyl group and a long-chain alkenyl group which has 8 or more carbon atoms and which may be branched.

Here, the (meth)acrylate compound (A) may include "the long-chain alkyl group having 8 or more carbon atoms, which may be branched" and "the long-chain alkenyl group having 8 or more carbon atoms, which may be branched" in the form of a long-chain alkyl ester or long-chain alkenylester of a (meth)acrylic acid, or others (e.g. alkyl group or alkenyl group having 8 or more carbon atoms, originated from saturated or unsaturated fatty acid having 9 or more carbon atoms, which may be branched). Particularly, it is preferred that the long-chain alkyl group and/or long-chain alkenyl group included in the (meth) acrylate compound (A) may be a long-chain alkyl group and/or a long-chain alkenyl group having 9 or more carbon atoms which may be branched, since it is easily segregated to the fabricated edge of the material originated from the (meth) acrylate compound (A).

More specifically, the (meth)acrylate compound (A) may be straight-chain or branched alkyl ester having 8 or more, preferably 10 or more carbon atoms of (meth)acrylic acid such as lauryl(meth)acrylate, stearyl(meth)acrylate, isostearyl(meth)acrylate; a straight chain or branched alkenylester having 8 or more, preferably 10 or more carbon atoms such as oleyl(meth)acrylate, linoleyl(meth)acrylate and linolenyl(meth)acrylate; and a reaction product (polyhydric ester) of polyhydric alcohol such as dipentaerythritoltri (meth)acrylatetriundecylate, (meth)acrylic acid with fatty acid (saturated or unsaturated fatty acid) having 9 or more carbon atoms, but is not limited thereto.

Among them, the lauryl(meth)acrylate or isostearyl(meth) acrylate is preferably used in consideration of the color and smoothness of the three-dimensional object.

As an epoxy compound (B) of the segregation component, any epoxy compound having at least one group selected from a long-chain alkyl group and long-chain alkenyl group, which have 8 or more carbon atoms which may be branched, can be used. Examples of the epoxy compound (B) includes epoxidized soybean oil, epoxidized linseed oil, α-olefinepoxide (long-chain alkylglycidyl compound) in which an epoxy group is bonded to an end (the α-position) of an alkyl group having 8 or more carbon atoms, monoglycidyl ether of aliphatic higher alcohol having 8 or more carbon atoms, glycidyl ester of higher fatty acid having 8 or more carbon atoms, and an alkyl ester having 8 or more carbon atoms of epoxy hexahydro phthalic acid such as epoxy hexahydro dioctyl phthalate, epoxy hexahydro phthalic acid di-2-ethylhexyl, but are not limited thereto.

As a hindered phenol compound (C), any hindered phenol compound such as used an antioxidant of plastic in the background art can be used. Examples of the hindered phenol compound (C) include 1-hydroxy-cyclohexylphenylketone, pentaerythritol tetrakis[3-(3,5-di-tert-butyl-4-hydroxyphenyl)propionate], thiodiethylene bis[3-(3,5-di-tert-butyl-4-hydroxyphenyl)propionate], octadecyl-3-(3,5-di-tert-butyl-4-hydroxyphenyl)propionate], N,N'-hexane-1,6-diylbis[3-(3,5-di-tert-butyl-4-hydroxyphenyl)propionamide], but are not limited thereto.

As a dialkyl phthalate compound (D), any straight-chain or branched dialkyl ester having 8 or more carbon atoms of phthalic acid which may have a substituent in a benzene ring can be used. Two alkyl groups of the dialkyl phthalate compound (D) may be the same or different from each other.

Examples of the dialkyl phthalate compound (D) include di-2-ethylhexyl phthalate, di-n-octyl phtalate, di-n-nonyl phthalate, di-n-decyl phtalate and di-tridecyl phthalate, but are not limited thereto.

As a trialkyl trimellitate compound (E), any straight-chain or branched trialkylester having 8 or more carbon atoms of a trimellitic acid which may have a substituent in a benzene ring can be used. Three alkyl groups of the trialkyl trimellitate compound (E) may be the same or different from one another.

Examples of the trialkyl trimellitate compound (E) include tri-2-ethylhexyl trimellitate, tri-n-octyl trimellitate, tri-isononyl trimellitate, tri-n-decyl trimellitate and triisodecyl trimellitate, but are not limited thereto.

The actinic radiation-curable resin composition according to the present invention can include one or two or more of the (meth)acrylate compound (A), the epoxy compound (B), the hindered phenol compound (C), the dialkyl phthalate compound (D) and the trialkyl trimellitate compound (E) as the segregation component.

The content of the segregation component of the actinic radiation-curable resin composition can be adjusted in accordance with the kind of a resin included in the actinic radiation-curable resin composition and a composition of the actinic radiation-curable resin composition, and is preferably 1 to 20 wt %, and more preferably 3 to 10 wt % based on the entire weight of the actinic radiation-curable resin composition. When the content of the segregation component is too small, the segregation amount of the segregation component and/or the material originated from the component in the uneven portion of the fabricated edge of the three-dimensional object decreases, thereby hardly reducing the unevenness degree and smoothing the fabricated edge. Meanwhile, when the content of the segregation component is too large, incomplete curing may occur when the actinic radiation ray is irradiated to the fabricated edge, molding accuracy may be lowered, the surface of the three-dimensional object may be contaminated by bleed out of the segregation component and washing efficiency may be lowered.

In manufacturing a three-dimensional object according to the present invention, as an actinic radiation-curable composition, used can be any actinic radiation-curable composition including such a component that when a molding method of the present invention, which includes: irradiating a fabricating surface with an actinic radiation ray to form a cured resin layer having a predetermined shaped pattern; and repeating a fabricating procedure including: providing the actinic radiation-curable resin composition on the cured resin layer to form a fabricating surface; and irradiating the fabricating surface with an actinic radiation ray to form a cured resin layer having a predetermined shaped pattern, is conducted, the component is segregated to molding end parts of the respective cured resin layers to reduce the unevenness degree of at least a part of the uneven portion in the fabricated edge of the eventually obtained three-dimensional object, and preferably can be used any actinic radiation-curable composition including one or two or more of the (meth)acrylate compound (A), the epoxy compound (B), the hindered phenol compound (C), the dialkyl phthalate compound (D), and the trialkyl trimellitate compound (E).

Examples of the actinic radiation-curable resin composition according to the present invention include (a) an actinic radiation-curable resin composition which includes a cationic polymerizable organic compound and an actinic radiation-sensitive cationic-polymerization initiator which are different from a segregation component, together with the segregation component to be segregated to the fabricated edge, which is one or two or more of the (meth)acrylate compound (A), the epoxy compound (B), the hindered phenol compound (C), the dialkyl phthalate compound (D) and the trialkyl trimellitate compound (E);

(b) an actinic radiation-curable resin composition which includes a radical polymerizable organic compound and an actinic radiation-sensitive radical-polymerization initiator which are different from a segregation component, together with the segregation component to be segregated to the fabricated edge, which is one or two or more of the (meth) acrylate compound (A), the epoxy compound (B), the hindered phenol compound (C), the dialkyl phthalate compound (D) and the trialkyl trimellitate compound (E); and (c) an actinic radiation-curable resin composition which includes a cationic polymerizable organic compound, a radical polymerizable organic compound, an actinic radiation ray sensitive cationic polymerization initiator and an actinic radiation-sensitive radical-polymerization initiator which are different from a segregation component, together with the segregation component to be segregated to the fabricated edge, which is one or two or more of the (meth)acrylate compound (A), the epoxy compound (B), the hindered phenol compound (C), the dialkyl phthalate compound (D) and the trialkyl trimellitate compound (E).

Among them, in the present invention, as an actinic radiation-curable resin composition, the actinic radiation-curable resin composition of the above (c) is preferable from the viewpoints that segregating the segregation component and/or the material originated from the segregation component is appropriately performed and smoothing the uneven portion of the fabricated edge of the three-dimensional object is also appropriately performed by the segregating; the curing sensitivity to an actinic radiation ray is high to product a molding object for a reduced irradiation time of the actinic radiation ray; and there are advantages on the resolution and molding accuracy to obtain a three-dimensional object having an intend size and a high quality.

Particularly, when, as an actinic radiation-curable resin composition in the above (c), used be an actinic radiation-curable resin composition (hereinafter, referred to as an actinic radiation-curable resin composition (c')) including a cationic polymerizable organic compound different from a segregation component [particularly, epoxy compound (B)], a radical polymerizable organic compound different from the segregation component [particularly, (meth)acrylate compound (A)], an actinic radiation-sensitive cationic-polymerization initiator and an actinic radiation-sensitive radical-polymerization initiator, together with the segregation component to be segregated to the fabricated edge, which is one or two or more of the (meth)acrylate compound (A), the epoxy compound (B), the hindered phenol compound (C), the dialkyl phthalate compound (D) and the trialkyl trimellitate compound (E), and further including an oxetane monoalcohol and/or a (meth)acrylate compound having an oxetane ring, the size accuracy can be improved by reduced volumetric shrinkage during a curing process and the dimensional stability can be improved by enhanced water resistance and moisture resistance, in addition to the excellent properties as mentioned above such as the segregation of the segregation component and/or the material originated from the segregation component in the uneven portion of the fabricated edge of the three-dimensional object, the smoothing of the uneven portion by the segregation, the reduction of the molding time by improving the curing sensitivity, and the improvement of the molding accuracy by the enhanced resolution.

The actinic radiation-curable resin composition in the above (c) preferably includes: the segregation component in 1 to 20 wt % which is one or two or more of the compounds (A) to (E); the cationic polymerizable organic compound different from the segregation component in 20 to 80 wt %; and the radical polymerizable organic compound different from the segregation component in 5 to 70 wt %, based on the total weight of the actinic radiation curable resin composition.

Further, the actinic radiation-curable resin composition in the above (c') preferably includes: the segregation component in 1 to 20 wt % which is one or two or more of the compounds (A) to (E); the cationic polymerizable organic compound different from the segregation component in 20 to 80 wt %; the radical polymerizable organic compound different from the segregation component in 5 to 70 wt %; and the oxetane monoalcohol and/or the (meta)acrylate compound including an oxetane ring (a total of both the oxetane monoalcohol and the (meth)acrylate compound including an oxetane ring) in 1 to 40 wt %, based on the total weight of the actinic radiation curable resin composition.

The actinic radiation-curable resin compositions in the above (c) and (c') preferably include the cationic polymerizable organic compound and the radical polymerizable organic compound in the weight ratio of the cationic polymerizable organic compound and the radical polymerizable organic compound of 9:1 to 1:2.5, and particularly 8:1 to 1:1.5, from the viewpoints of viscosity of the composition, reaction speed, molding speed, and size accuracy and mechanical properties of the obtained molding object.

Examples of the cationic polymerizable organic compound which may be used as the actinic radiation-curable resin compositions in the above (a), (c) and (c') include (1) an epoxy compound such as an alicyclic epoxy resin, an aliphatic epoxy resin and an aromatic epoxy resin; (2) an oxetane compound such as trimethylene oxide, 3,3-dimethyloxetane, 3,3-dichloromethyloxetane, 3-methyl-3-phenoxymethyloxetane, 1,4-bis [(3-ethyl-3-oxetanylmethoxy)methyl]benzene, an oxolane compound such as tetrahydrofuran, 2,3-dimethyltetrahydrofuran, ring-shaped ether or a ring-shaped acetal compound such as trioxane, 1,3-dioxolane, 1,3,6-trioxanecyclooctane; (3) a ring-shaped lactone compound such as β-propiolactone and ε-caprolactone; (4) a thiirane compound such as ethylene sulfide and thioepichlorohydrine; (5) a thiethane compound such as 1,3-propylene sulfide and 3,3-dimethylthiethane; (6) a vinyl ether compound such as ethylene glycol divinyl ether, alkyl vinyl ether, 3,4-dihydropyrane-2-methyl (3,4-dihydropyrane-2-carboxylate), triethylene glycol divinyl ether; (7) a spiroorthoester compound obtained by reaction of an epoxy compound with lactone; (8) an ethylenic unsaturated compound such as vinylcyclohexane, isobutylene and polybutadiene.

Among the above, as the cationic polymerizable organic compound, an epoxy compound is preferably used, and a polyepoxy compound having two or more epoxy groups in the molecule is more preferably used. Particularly, when as the cationic polymerizable organic compound, used be an epoxy compound (mixture of epoxy compounds) which has an alicyclic polyepoxy compound having two or more epoxy groups in the molecule in 30 wt % or more, and more preferably 50 wt % or more based on the total weight of the epoxy compound, the viscosity of the actinic radiation-curable resin composition is lowered to efficiently make the three-dimensional object, and more over the cationic polymerization speed, the curability of thick layers, the resolution and the ultraviolet transmittance are improved and reduced the volumetric shrinkage of the obtained three-dimensional object.

Examples of the alicyclic epoxy resin include polyglycidyl ether of polyol having at least one alicyclic ring, cyclohexene oxide or cyclopentene oxide-containing compound, obtained by epoxidizing cyclohexene or cyclopentene ring-containing compound with a proper oxidizing agent such as hydrogen peroxide or peracid. More specifically, examples of the alicyclic epoxy resin include hydrogenated bisphenol A diglycidyl ether, 3,4-epoxycyclohexylmethyl-3',4'-epoxycyclohexanecarboxylate, 2-(3,4-epoxycyclohexyl-5,5-spiro-3,4-epoxy)cyclohexane-metha-dioxane, bis(3,4-epoxycyclohexylmethyl)adipate, vinylcyclohexene dioxide, 4-vinylepoxycyclohexane, bis(3,4-epoxy-6-methylcyclohexylmethyl)adipate 3,4-epoxy-6-methylcyclohexyl-3,4-epoxy-6-methylcyclohexanecarboxylate, methylenebis(3,4-epoxycyclohexane), dicyclopentadienediepoxide, di(3,4-epoxycyclohexylmethyl)ether of ethyleneglycol, and ethylenebis(3,4-epoxycyclohexanecarboxylate).

Examples of the aliphatic epoxy resin include polyglycidyl ether of aliphatic polyol or an alkylene oxide adduct, polyglycidyl ester of aliphatic long-chain polybasic acid or a homopolymer or copolymer of glycidyl acrylate or glycidyl methacrylate. More specifically, examples of the aliphatic epoxy resin include diglycidyl ether of 1,4-butandiol, diglycidyl ether of 1,6-hexanediol, triglycidyl ether of glycerin, diglycidyl ether of trimethylolpropane, triglycidyl ether of trimethylolpropane, tetraglycidyl ether of sorbitol, hexaglycidyl ether of dipentaerythritol, diglycidyl ether of polyethylene glycol, diglycidyl ether of polypropylene glycol, polyglycidyl ether of polyetherpolyol obtained by adding one or at least two alkylene oxide to aliphatic polyol such as ethylene glycol, propylene glycol and glycerin, and diglycidyl ester of aliphatic long-chain dibasic acid.

Examples of the aromatic epoxy resin include mono or polyphenol having at least one aromatic ring or mono or polyglycidyl ether of the alkylene oxide adduct. More specifically, examples of the aromatic epoxy resin include glycidyl ether obtained by reaction of bisphenol A, bisphenol F, or its alkylene oxide adduct with epichlorohydrine, an epoxynovolak resin, mono or polyglycidyl ether of phenol, cresol, butyl phenol, or polyether alcohol obtained by adding alkylene oxide to phenol, cresol, butylphenol.

The actinic radiation-curable resin compositions in the above (a), (c) and (c') can include one or two or more of the above epoxy compounds. As described above, as the cationic polymerizable organic compound, an epoxy compound having, in at least 30 wt %, a polyepoxy compound with at least two epoxy groups in the molecule is preferably used.

As the radical polymerizable organic compound in the actinic radiation-curable resin compositions in the above (b), (c) and (c'), can be used any compound which causes polymerization and/or cross-linking upon irradiation of an actinic radiation ray under the presence of an actinic radiation-sensitive radical-polymerization initiator, and illustrative examples of the radical polymerizable organic compound include a (meth)acrylate compound, an unsaturated polyester compound, an allylurethane compound and a polythiol compound, and one or two or more of the foregoing radical polymerizable organic compounds can be used. Among them, a compound which has at least one (meth)acrylic group in the molecule is preferably used, and examples of the compound include a reaction product of an epoxy compound with (meth)acrylic acid, (meth)acrylic acid ester of alcohol, urethane (meth)acrylate, polyester (meth)acrylate and polyether (meth)acrylate.

Examples of the reaction product of the epoxy compound with (meth)acrylic acid includes a (meth)acrylate reaction product which is obtained by reaction of an aromatic epoxy compound, an alicyclic epoxy compound and/or an aliphatic epoxy compound with (meth)acrylic acid. Examples of the (meth)acrylate reaction product obtained by the reaction of the aromatic epoxy compound with the (meth)acrylic acid include (meth)acrylate obtained by reaction of glycidyl ether, which is obtained a bisphenol compound such as bisphenol A or bisphenol S or its alkyleneoxide adduct with the epoxidizing agent such as epichlorohydrine, with (meth)acrylic acid, with (meth)acrylate reaction product which is obtained by reaction of an epoxynovolak resin with (meth)acrylic acid.

Examples of the (meth)acrylic acid ester of alcohol include (meth)acrylate obtained by reaction of aromatic alcohol, aliphatic alcohol and alicyclic alcohol having at least one hydroxyl group in the molecule and/or an alkyleneoxide adduct thereof with (meth)acrylic acid.

More specifically, examples of the (meth)acrylic acid ester of alcohol include 2-ethylhexyl(meth)acrylate, 2-hydroxyethyl (meth)acrylate, 2-hydroxypropyl(meth)acrylate, lauryl (meth)acrylate, stearyl(meth)acrylate, isooctyl(meth)acrylate, tetrahydrofurfuryl(meth)acrylate, isobonyl(meth)acrylate, benzyl(meth)acrylate, 1,4-butandiol di(meth)acrylate, 1,6-hexanediol di(meth)acrylate, diethyleneglycol di(meth)acrylate, triethyleneglycol di(meth)acrylate, neopentylglycol di(meth)acrylate, polyethyleneglycol di(meth)acrylate, polypropyleneglycol di(meth)acrylate, trimethylolproane tri(meth)acrylate, pentaerythritol tri(meth)acrylate, dipentaerythritol poly(meth)acrylate [dipentaerythritolpenta (meth)acrylate, dipentaerythritol hexa(meth)acrylate, etc.], etoxizied pentaerythritol tetra(meth)acrylate and (meth)acrylate of an alkylene oxide adduct of the foregoing polyol such as diol, triol, tetraol and hexaol.

Among them, as (meth)acrylate of alcohol, (meth)acrylate which has at least two (meth)acrylic groups in the molecule and is obtained by reaction of polyol with (meth)acrylic acid is preferably used.

Among the foregoing (meth)acrylate compounds, the acrylate compound is more preferably used than the methacrylate compound from the viewpoint of polymerization rate.

Examples of the urethane (meth)acrylate include (meth) acrylate which is obtained by reaction of a hydroxyl group-containing (meth)acrylic acid ester with an isocyanate compound.

Examples of the hydroxyl group-containing (meth)acrylic acid ester preferably include hydroxyl group-containing (meth)acrylic acid ester which is obtained by esterification of aliphatic divalent alcohol with (meth)acrylic acid, and more specifically, 2-hydroxyethyl(meth)acrylate. As the isocyanate compound, a polyisocyanate compound which has at least two isocyanate groups in the molecule such as tolylene diisocyanate, hexamethylene diisocyanate and isophorone diisocyanate is preferable.

Further, examples of the polyester (meth)acrylate include polyester (meth)acrylate which is obtained by reaction of hydroxyl group-containing polyester with (meth)acrylic acid.

Examples of the polyether (meth)acrylate include polyether acrylate which is obtained by reaction of hydroxyl group-containing polyether with acrylic acid.

As the actinic radiation-sensitive cationic-polymerization initiator (hereinafter, referred to as a "cationic polymerization initiator") in the actinic radiation-curable resin compositions in the (a), (c) and (c'), any polymerization initiator which initiates cationic polymerization of the cationic polymerizable organic compound upon irradiation of an actinic radiation ray can be used. Examples of the cationic polymerization initiator include tetrafluoroboric acid triphenylphenacylphosphonium, hexafluoroantimonic acid triphenylsulfonium, bis[4-(diphenylsulfonio)phenyl]sulfide bishexafluoroantimonate, bis-[4-(di4'-hydroxyetoxyphenylsulfonio) phenyl]sulfide dihexafluoroantimonate, bis-[4-(diphenylsulfonio)phenyl]sulfide dihexafluorophosphate, tetrafluoro boric acid diphenyl iodinium, and one or two or more of them can be used.

For the purpose to improve the reaction speed, a photo sensitizer, e.g. benzophenone, benzoin alkyl ether and thioxanthone can be used together with the cationic polymerization initiator.

In the present invention, as the actinic radiation ray sensitive radical polymerization initiator (hereinafter, referred to a "radical polymerization initiator"), any polymerization initiator which initiates radical polymerization of a radical polymerizable organic compound upon irradiation of an actinic radiation ray can be used. Examples of the radical polymerization initiator include a phenylketone compound such as 1-hydroxy-cyclohexyl phenylketone, a benzyl or dialkyl acetal compound thereof such as benzyl dimethyl ketal, benzyl β-methoxyethyl acetal and 1-hydroxycyclohexylphenylketone, an acetophenone compound such as diethoxyacetophenone, 2-hydroxymethyl-1-phenylpropane-1-on, 4'-isopropyl-2-hydroxy-2-methyl-propiophenone, 2-hydroxy-2-methyl-propiophenone, p-dimethylaminoacetophenone, p-tert-butyldichloroacetophenone, p-tert-butyltrichloroacetophenone, p-azidebenzalacetophenone, a benzoin or alkylether compound thereof such as benzoin, benzoin methyl ether, benzoin ethyl ether, benzoin isopropyl ether, benzoin n-butyl ether, benzoin isobutyl ether, a benzophenone compound such as benzophenone, methyl o-benzoil benzoate, Michler's ketone, 4,4'-bisdiethylaminobenzophenone, 4,4'-dichlorobenzophenone and a thioxanthone compound such as thioxanthone, 2-methylthioxanthone, 2-ethylthioxanthone, 2-chlorothioxanthone and 2-isopropylthioxanthone.

The actinic radiation-curable resin compositions in the above (c) and (c') preferably include: the cationic polymerization initiator in 1 to 10 wt %; and the radical polymerization initiator in 0.5 to 10 wt % with respect to the total weight of the cationic polymerizable organic compound and the radical polymerizable organic compound, and more preferably include: the cationic polymerization initiator in 2 to 6 wt % and the radical polymerization initiator in 1 to 5 wt % with respect to the total weight of the cationic polymerizable organic compound and the radical polymerizable organic compound.

As the oxetane monoalcohol compound in the actinic radiation-curable resin composition (c'), any compound which has at least one oxetane group and one alcoholic hydroxyl group in the molecule can be used, and more preferably, an oxetane monoalcohol compound represented by the following formula (1) can be used.

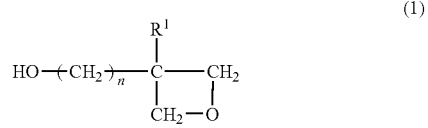

(1)

(In the formula, R1 represents an alkyl group, aryl group or aralkyl group, and n represents an integer of 1 to 6.)

In the formula (1), examples of R1 include an alkyl group having 1 to 10 carbon atoms such as methyl, ethyl, propyl, butyl, pentyl, hexyl, heptyl, octyl, nonyl and decyl, an aryl group such as phenyl, tolyl, naphthyl, methylphenyl, and an aralkyl group such as benzyl and β-phenylethyl group, and R1 is preferably a lower alkyl group such as methyl, ethyl, propyl and butyl.

In the formula (1), n is preferably an integer of 1 to 4.

Examples of the oxetane monoalcohol compound represented by the formula (1) include 3-hydroxymethyl-3-methyloxetane, 3-hydroxymethyl-3-ethyloxetane, 3-hydroxymethyl-3-propyloxetane, 3-hydroxymethyl-3-n-butyloxetane, 3-hydroxymethyl-3-phenyloxetane, 3-hydroxymethyl-3-benzyloxetane, 3-hydroxyethyl-3-methyloxetane, 3-hydroxyethyl-3-ethyloxetane, 3-hydroxyethyl-3-propyloxetane, 3-hydroxyethyl-3-phenyloxetane, 3-hydroxypropyl-3-methyloxetane, 3-hydroxypropyl-3-ethyloxetane, 3-hydroxypropyl-3-propyloxetane, 3-hydroxypropyl-3-phenyloxetane and 3-hydroxybutyl-3-methyloxetane.

The actinic radiation-curable resin composition (c') can include one or at two or more of the foregoing oxetane monoalcohol compounds, and preferably, 3-hydroxymethyl- 3-methyloxetane and/or 3-hydroxymethyl-3-ethyloxetane from the viewpoint of availability.

Examples of the (meth)acrylate compound having an oxetane ring included in the actinic radiation-curable resin composition (c') include an ester compound obtained by reaction of the oxetane monoalcohol compound with (meth)acrylic acid. Examples of the ester compound include (3-methyl-3-oxetanyl)methyl(meth)acrylate, (3-ethyl-3-oxetanyl)methyl(meth)acrylate, (3-propyl-3-oxetanyl)methyl(meth)acrylate, (3-phenyl-3-oxetanyl)methyl(meth)acrylate, (3-benzyl-3-oxetanyl)methyl(meth)acrylate, (3-methyl-3-oxetanyl)ethyl(meth)acrylate, (3-ethyl-3-oxetanyl)ethyl(meth)acrylate, (3-propyl-3-oxetanyl)ethyl(meth)acrylate, (3-phenyl-3-oxetanyl)ethyl(meth)acrylate, (3-benzyl-3-oxetanyl)ethyl(meth)acrylate, (3-methyl-3-oxetanyl)propyl(meth)acrylate, (3-ethyl-3-oxetanyl)propyl(meth)acrylate, (3-propyl-3-oxetanyl)propyl(meth)acrylate, (3-phenyl-3-oxetanyl)propyl(meth)acrylate, and (3-benzyl-3-oxetanyl)propyl(meth)acrylate.

The actinic radiation-curable resin composition (c') can include one or two or more of the foregoing ester compounds. Among them, as the (meth)acrylate compound having an oxetane ring, (3-methyl-3-oxetanyl)methyl(meth)acrylate and/or (3-ethyl-3-oxetanyl)methyl(meth)acrylate is preferably used from the viewpoint of availability.

The actinic radiation-curable resin composition used for manufacturing the three-dimensional object according to the present invention may include one or two or more of a coloring agent such as a pigment or dye, an antifoaming agent, an leveling agent, a thickening agent, a fire retardant, an antioxidant, a filler (silica, glass powder, ceramics powder, metal powder, etc.) and a modifying resin, if necessary, unless advantages of the present invention are ruined.

A three-dimensional object of the present invention is manufactured by using the foregoing actinic radiation-curable resin composition. In manufacturing a three-dimensional object, a fabrication method which is used widely in stereolithography in the background art is adopted, which includes: forming a fabricating surface with the resin composition; irradiating the fabricating surface with an actinic radiation ray to form a cured resin layer having a predetermined shaped pattern; and then repeating a fabricating procedure including: providing the actinic radiation-curable resin composition on the cured resin layer to form a fabricating surface; and irradiating the fabricating surface with an actinic radiation ray to form a cured resin layer having a predetermined shaped pattern, until a three-dimensional object which has desired shape and size is formed. By conducting fabrication in such a way, a three-dimensional object of the present invention can be obtained, which has a plurality of cured resin layers stacked and in which the unevenness degree of at least a part of the uneven portion in the fabricated edge of the three-dimensional object is reduced by segregating a component included in the actinic radiation-curable resin composition and/or a material originated from the component so that the fabricated edge is smoothed.

To manufacture the three-dimensional object, examples of the actinic radiation ray include ultraviolet rays, electronic rays, X-rays, radiant rays and high frequency waves. Particularly, ultraviolet rays having a wavelength of 300 to 400 nm are preferably used from the view point cost-efficiency. Examples of the light source include an ultraviolet rays laser (e.g. Ar laser, He—Cd laser, etc.), a high-pressure mercury lamp, an ultra-pressure mercury lamp, a mercury lamp, a xenon lamp, a halogen lamp, a metal halide lamp, an ultraviolet LED (light emitting diode) lamp, etc.

To form the respective cured resin layers having a predetermined shaped pattern by irradiating a fabricating surface of the actinic radiation-curable resin composition with an actinic radiation ray, the actinic radiation ray may be focused in a point such as laser to form cured resin layers with point or line shape, or the actinic radiation ray may be planarly irradiated to a fabricating surface through a planner mask having a plurality of liquid crystal shutters or digital micro mirror shutters to form cured resin layers.

EXAMPLES

Hereinafter, examples of the present invention are described in detail. However, the present invention is not limited to the following examples.

In the examples, the measurement of the surface roughness Ra of a fabricated edge part of a three-dimensional object and the transparency of the three-dimensional object in the fabricated edge direction, and the test of segregation in the fabricated edge of the three-dimensional object are performed as follows.

Hereinafter, "parts" represents "parts by weight".

(Measurement of Surface Roughness Ra of Fabricated Edge of Three-Dimensional Object)

A roughness of the surface of the fabricated edge of the three-dimensional object obtained in Examples and Comparative Example was measured by a surface shape measuring device (DEKTAK3 manufactured by ULVAC Japan, Ltd.) and based on the measurement value, a surface roughness Ra (arithmetic average surface roughness Ra) of the fabricated edge was calculated according to JIS B0601.

(Measurement of Transparency in Perpendicular Direction of Fabricated Edge of Three-Dimensional Object)

Visible light (wavelength of 500 to 700 nm (wavelength not absorbed by the three-dimensional object)) is irradiated in a direction (direction X in FIGS. 1 and 4) perpendicular to a fabricated edge (surface Sz in the right side in FIGS. 1 and 4) of the three-dimensional object according to Examples and Comparative Example and the amount of the visible light (energy intensity) emitted from a fabricated edge (surface Sz in the left side in FIGS. 1 and 4) on the other side of the three-dimensional object was measured with a photoelectric spectrophotometer (UV-2400S manufactured by Shimadzu Corporation) to determine the transmittance (%) of the light as the transparency.

(Test of Segregation in Fabricating Surface of Three-Dimensional Object)

The composition of the fabricated edge of the three-dimensional object obtained in Examples and Comparative Example was analyzed by X-ray photoelectron spectroscopy (ESCA) (ESCALAB 200-S manufactured by VG Scientific). When at least a part of concentration of measured carbon atom or oxygen atom is different from average concentration of carbon atom and oxygen atom calculated by the overall composition of the photocurable resin composition used to form the three-dimensional object (when the measured concentration is out of the average value), it is determined to be "segregated." When the part of the concentration is equivalent to the average value, it is determined to be "not segregated."

Example 1

(1) 60 parts of hydrogenated bisphenol A diglycidyl ether, 20 parts of 3-hydroxymethyl-3-ethyloxetane, 4 parts of bis-[4-(diphenylsulfonio)phenyl]sulfide bishexafluoroantimonate (cationic polymerization initiator), 10 parts of dipentaerythritol polyacrylate ("NK Ester A-9530" manufactured by Shin-Nakamura Chemical Co., Ltd.), 3 parts of 1-hydroxy-cyclohexylphenylketone (radical polymerization initiator), and 6 parts of laurylacrylate were mixed to prepare a photocurable resin composition, and the photocurable resin composition was accommodated in a tank shielding light.

(2) By using The photocurable resin composition obtained in the above (1), a three-dimensional object (10 mm×10 mm×40 mm) shaped like a square column as shown in FIG. 1 was manufactured with an ultra-speed stereolithography system ("SOLIFORM500B" manufactured by TeijinSeiki Co., Ltd.) in which stereolithography was performed to perpendicularly irradiate the surface with "Semiconductor-excited solid laser BL6 type" (1000 mW output: 355 nm wavelength) which is manufactured by Spectra-Physics KK under conditions of irradiation energy of 100 to 120 mJ/cm2, a slice pitch (thickness of stacked layers) of 0.10 mm and average two minute molding for each layer.

(3) The surface roughness Ra of the fabricated edge of the three-dimensional object obtained in the above (2) was measured by the foregoing method, and the measured surface roughness Ra was 789 Å.

Transparency (transmittance of visible light) was measured in a direction perpendicular to the fabricated edge of the three-dimensional object obtained in the (2), and the measured transparency was 95%.

The segregation of the fabricated edge of the three-dimensional object was tested by the foregoing method and the segregation was confirmed.

Comparative Example (1) A photocurable resin composition was prepared in the same manner as the (1) of Example 1 except that 6 parts of laurylacrylate was not mixed, and was accommodated in a tank.

(2) Stereolithography was performed by using the photocurable resin composition obtained in the (1) with the same method as the (2) of Example 1, and thus a three-dimensional object (10 mm×10 mm×40 mm) which is shaped like a square column as in FIG. 1 was manufactured.

(3) A surface roughness Ra of the fabricated edge of the three-dimensional object obtained in (2) was measured, and the measured surface roughness Ra was 4,194 Å.

Transparency (transmittance of visible light) was measured in a direction perpendicular to the fabricated edge of the three-dimensional object obtained in the (2), and the measured transparency was 65%.

The segregation of the fabricated edge of the three-dimensional object was tested by the foregoing method, and the concentration of carbon atoms and oxygen atoms were equivalent to the average value of the photocurable resin composition used to form the three-dimensional object to determine that the segregation did not occur.

Examples 2 to 5

(1) Components in Table 1 were mixed at a ratio shown in Table 1 to prepare a photocurable resin composition and the photocurable resin composition was accommodated in a tank.

(2) An optical three-dimensional molding was performed by using the photocurable resin composition obtained in the above (1) with the same method as the (2) of Example 1, and a three-dimensional object (10 mm×10 mm×40 mm) which is shaped like a square column as in FIG. 1 was manufactured.

(3) With respect to the three-dimensional object obtained in the above (2), a surface roughness Ra of the fabricated edge and a transparency (transmittance of visible light) in a direction perpendicular to the fabricated edge were measured with the foregoing method, and the result was as shown in Table 1. The segregation of the fabricated edge of the three-dimensional object was tested by the foregoing method, and the result was as shown in Table 1.

TABLE 1

|  | Example 2 | Example 3 | Example 4 | Example 5 |
|---|---|---|---|---|
| (Photocurable resin composition 1)) (parts) |  |  |  |  |
| Epoxy compound (a) | 60 | 50 | 40 | 50 |
| Epoxy compound (b) | 3 | 10 | 20 | 10 |
| Epoxy compound (c) | 1 |  |  |  |
| Acrylic compound (a) | 10 | 10 | 20 | 10 |
| Acrylic compound (b) | 1 |  |  |  |
| Oxetane compound (a) | 20 | 20 | 10 | 20 |
| Cationic polymerizable initiator (a) | 4 | 4 | 4 | 4 |
| Radical polymerizable initiator (a) | 3 | 3 | 3 | 3 |
| Segregation component |  |  |  |  |
| Laurylacrylate | 9 |  |  |  |
| Stearylacrylate |  | 3 |  |  |
| Isostearylacrylate |  |  | 10 |  |
| Polyacrylate (a) |  |  |  | 6 |
| (Properties of three-dimensional object) |  |  |  |  |
| Surface roughness Ra of fabricating surface | 789 Å | 580 Å | 2,076 Å | 987 Å |
| Transparency of fabricating surface (direction perpendicular to fabricating surface) | 95% | 93% | 92% | 91% |
| Segregation state | segregated | segregated | segregated | Segregated |

1) Kinds of components of photocurable resin composition:
Epoxy compound (a): hydrogenated bisphenol A diglycidyl ether
Epoxy compound (b): 3,4-epoxycyclohexylmethyl-3',4'-epoxycyclohexanecarboxylate ("UVR-6105" manufactured by Dow chemical Company)
Epoxy compound (c): trimethylolpropane polyglycidyl ether ("Denacol EX-321" manufactured by Nagase Kasei Kogyo K.K.)
Acrylic compound (a): dipentaerythritol polyacrylate ("NK Ester A-9530" manufactured by Shin-Nakamura Chemical Co., Ltd.)
Acrylic compound (b): ethoxized pentaerythritol tetraacrylate
Oxetane compound (a): 3-hydroxymethyl-3-ethyloxetane
Cationic polymerizable initiator (a): [bis{4-(diphenylsulfonio)phenyl}] sulfide bishexafluoroantimonate
Radical polymerization initiator (a): 1-hydroxy-cyclohexylphenylketone
Polyacrylate (a): dipentaerythritol triacrylate triundecylate Examples 6 to 9

(1) Components in Table 2 were mixed at a ratio shown in Table 2 to prepare a photocurable resin composition and the photocurable resin composition was accommodated in a tank.

(2) An optical three-dimensional molding was performed by using the photocurable resin composition obtained in the above (1) with the same method as the (2) of Example 1, and a three-dimensional object (10 mm×10 mm×40 mm) which is shaped like a square column as in FIG. 1 was manufactured.

(3) With respect to the three-dimensional object obtained in the above (2), a surface roughness Ra of the fabricated edge and a transparency (transmittance of visible light) in a direction perpendicular to the fabricated edge were measured with the foregoing method, and the result was as shown in Table 2. The segregation of the fabricated edge of the three-dimensional object was tested by the foregoing method, and the result was as shown in Table 2.

TABLE 2

|  | Example 6 | Example 7 | Example 8 | Example 9 |
|---|---|---|---|---|
| (Photocurable resin composition 1) (parts)) | | | | |
| Epoxy compound (d) | 60 | 60 | 60 | 60 |
| Epoxy compound (b) | 5 | 5 | 5 | 5 |
| Acrylic compound (a) | 10 | 10 | 10 | 10 |
| Oxetane compound (b) | 20 | 20 | 20 | 20 |
| Cationic polymerizable initiator (a) | 4 | 4 | 4 | 4 |
| Radical polymerizable initiator (a) | 3 | 3 | 3 | 3 |
| Segregation component | | | | |
| Sterically-hindered phenol (a) | 6 | | | |
| Sterically-hindered phenol (b) | | 6 | | |
| Bisethylhexyl phthalate | | | 6 | |
| Trimellitate (a) | | | | 6 |
| (Properties of three-dimensional object) | | | | |
| Surface roughness Ra of fabricating surface | 850 Å | 787 Å | 550 Å | 1,024 Å |
| Transparency of fabricating surface (direction perpendicular to fabricating surface) | 95% | 94% | 93% | 95% |
| Segregation state | segregated | segregated | segregated | Segregated |

1) Kinds of components of photocurable resin composition:
Epoxy compound (d): 1,4-cyclohexanedimethanol diglycidylether
Epoxy compound (b): 3,4-epoxycyclohexylmethyl-3',4'-epoxycyclohexanecarboxylate
Acrylic compound (a): dipentaerythritol polyacrylate ("NK Ester A-9530" manufactured by Shin-Nakamura Chemical Co., Ltd.)
Oxetane compound (b): (3-ethyl-3-oxetanyl) methylacrylate
Cationic polymerization initiator (a): [bis-{4-(diphenylsulfonio)phenyl}] sulfide bish-exafluoroantimonate
Radical polymerization initiator (a): 1-hydroxy-cyclohexylphenyl ketone
Sterically-hindered phenol (a): pentaerythritol tetrakis [3-(3,5-di-t-butyl-4-hydroxyphenyl) propionate] ("IRGANOX 1010" manufactured by Ciba Specialty Chemicals)
Sterically-hindered phenol (b): thiodiethylene-bis[3-(3,5-di-tert-butyl-4-hydroxyphenyl) propionate] ("IRGANOX 1035" manufactured by Ciba Specialty Chemicals)
Trimellitate (a): tri-n-octyl trimellitate Examples 10 to 13

(1) Components in Table 3 were mixed at a ratio shown in Table 3 to prepare a photocurable resin composition and the photocurable resin composition was accommodated in a tank.

(2) An optical three-dimensional molding was performed by using the photocurable resin composition obtained in the above (1) with the same method as the (2) of Example 1, and a three-dimensional object (10 mm×10 mm×40 mm) which is shaped like a square column as in FIG. 1 was manufactured.

(3) With respect to the three-dimensional object obtained in the above (2), a surface roughness Ra of the fabricated edge and a transparency (transmittance of visible light) in a direction perpendicular to the fabricated edge were measured with the foregoing method, and the result was as shown in Table 3. The segregation of the fabricated edge of the three-dimensional object was tested by the foregoing method, and the result was as shown in Table 3.

TABLE 3

|  | Example 10 | Example 11 | Example 12 | Example 13 |
|---|---|---|---|---|
| (Photocurable resin composition 1) (parts) | | | | |
| Epoxy compound (a) | 45 | 45 | 45 | 45 |
| Epoxy compound (b) | 15 | 15 | 15 | 15 |
| Acrylic compound (a) | 10 | 10 | 10 | 10 |
| Oxetane compound (b) | 20 | 20 | 20 | 20 |
| Cationic polymerizable initiator (a) | 4 | 4 | 4 | 4 |
| Radical polymerizable initiator (a) | 3 | 3 | 3 | 3 |
| Segregation component | | | | |
| Epoxizied soybean oil (a) | 6 | | | |
| Di(higher alkyl) phthalate (a) | | 6 | | |
| Higher-α-olefinepoxide (a) | | | 6 | |
| | | | | 6 |
| (Properties of three-dimensional object) | | | | |
| Surface roughness Ra of fabricating surface | 989 Å | 761 Å | 850 Å | 514 Å |
| Transparency of fabricating surface (direction perpendicular to fabricating surface) | 95% | 96% | 92% | 93% |
| Segregation state | segregated | segregated | segregated | Segregated |

1) Kinds of components of photocurable resin composition:
Epoxy compound (a): hydrogenated bisphenol A diglycidyl ether
Epoxy compound (b): 3,4-epoxycyclohexylmethyl-3',4'-epoxycyclohexanecarboxylate
Acrylic compound (a): dipentaerythritolpoly acrylate ("NK Ester A-9530" manufactured by Shin-Nakamura Chemical Co., Ltd.)
Oxetane compound (b): (3-ethyl-3-oxetanyl)methyl acrylate
Cationic polymerization initiator (a): [bis-{4-(diphenylsulfonio)phenyl}] sulfidebish-exafluoroantimonate
Radical polymerization initiator (a): 1-hydroxy-cyclohexylphenylketone
Epoxizied soybean oil (a): "Kapox S-6" manufactured by Kao Corporation
Di'higher alkyl) phthalate (a): dialkyl(10 to 12 carbon atoms)phthalate (Vinycizer 124 manufactured by Kao Corporation)
Higher-α-olefinepoxide (a): α-olefinepoxide having 12 to 14 carbon atoms (AOE X-24 manufactured by Daicel Chemical Industries)

INDUSTRIAL APPLICABILITY

According to the present invention, a three-dimensional object, in which the unevenness degree of the fabricated edge is reduced and the fabricated edge is smoothed, its external appearance and transparency are improved, and the mechanical properties and molding accuracy are enhanced, can be obtained.

A three-dimensional object according to the present invention may be used as a model of precision parts, electric and electronic components, furniture, construction structures, automotive components, various containers, castings, metal molds and mother die, a processing model, a component for designing a complex heating medium circuit and a component for analyzing and planning a behavior of a complex heating medium.

The present invention has been described in detail and described with reference to particular embodiments. However, it is apparent to the skilled in the art that the embodiments can change or revise the present invention within the spirits and scopes thereof.

The present invention is based on Japanese Patent Application No. 2005-179040 filed Jun. 20, 2005, the content of which is incorporated herein by reference.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

We claim:

1. A method for manufacturing a transparent three-dimensional object, comprising:
   forming a fabricating surface of an actinic radiation-curable resin composition;
   irradiating the fabricating surface with an actinic radiation ray to form a cured resin layer having a shaped pattern;
   repeating a fabricating procedure including providing the actinic radiation-curable resin composition on the cured resin layer to form a fabricating surface; and
   irradiating the fabricating surface with an actinic radiation ray to form a cured resin layer having a shaped pattern,
   wherein the transparent three-dimensional object includes a plurality of stacked cured resin layers each having a shaped pattern, an unevenness degree of at least a part of an uneven portion at a fabricated edge of the transparent three-dimensional object being reduced by segregation of a component included in the actinic radiation-curable resin composition and/or a material originated from the component such that the fabricated edge is smoothed,
   wherein the actinic radiation-curable resin composition comprises the component which is segregated to the fabricated edge of a cured resin layer when the cured resin layer is formed; a cationic polymerizable organic compound; a radical polymerizable organic compound; a photo cationic-polymerization initiator; and a photo radical-polymerization initiator, which are different from the segregated component,
   wherein the component segregated to the fabricated edge of the cured resin layer includes at least one compound selected from (A) to (E):
   (A) a (meth)acrylate compound having at least one group selected from a long-chain alkyl group which has 8 or more carbon atoms and which is optionally branched, and a long-chain alkenyl group which has 8 or more carbon atoms and which is optionally branched;
   (B) an epoxy compound having at least one group selected from a long-chain alkyl group which has 8 or more carbon atoms and which is optionally branched, and a long-chain alkenyl group which has 8 or more carbon atoms and which is optionally branched;
   (C) a hindered phenol compound;
   (D) a dialkyl phthalate compound which has an alkyl group having 8 or more carbon atoms: and
   (E) a trialkyl trimellitate compound which has an alkyl group having 8 or more carbon atoms; and
   wherein a content of the component segregated to the fabricated edge of the cured resin layer when the cured resin layer is formed is 1 to 20 wt % of a total weight of the actinic radiation-curable resin composition.

2. The method according to claim 1, wherein the actinic radiation-curable resin composition further comprises an oxetane monoalcohol and/or a (meth)acrylate compound having an oxetane ring.

* * * * *